US012751327B2

(12) United States Patent
Cucci et al.

(10) Patent No.: US 12,751,327 B2
(45) Date of Patent: Sep. 29, 2026

(54) STRESS-REDUCTION STRUCTURES FOR A COMPOUND SEMICONDUCTOR LAYER STACK

(71) Applicant: GlobalFoundries U.S. Inc., Malta, NY (US)

(72) Inventors: Brett Cucci, Colchester, VT (US); Ramsey Hazbun, Colchester, VT (US); Richard Rassel, Essex Junction, VT (US); Zhong-Xiang He, Essex Junction, VT (US); Patrick Mitchell, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 375 days.

(21) Appl. No.: 18/232,876

(22) Filed: Aug. 11, 2023

(65) Prior Publication Data

US 2025/0054908 A1 Feb. 13, 2025

(51) Int. Cl.

| | |
|---|---|
| ***H10W 90/00*** | (2026.01) |
| ***H10W 20/00*** | (2026.01) |
| ***H10W 20/20*** | (2026.01) |
| *H10W 90/20* | (2026.01) |

(52) U.S. Cl.

CPC ......... *H10W 90/00* (2026.01); *H10W 20/023* (2026.01); *H10W 20/20* (2026.01); *H10W 90/297* (2026.01)

(58) Field of Classification Search

CPC ........... H01L 25/0657; H01L 21/76898; H01L 23/481; H01L 21/76224; H01L 21/763; H01L 21/7605; H01L 2225/06541; H10D 30/015; H10D 30/475; H10D 62/8503

See application file for complete search history.

(56) References Cited

U.S. PATENT DOCUMENTS

| | | | | |
|---|---|---|---|---|
| 8,441,105 B2 | 5/2013 | Sato et al. | | |
| 9,276,100 B2 * | 3/2016 | Endo | .................. | H10D 30/4755 |
| 9,818,700 B2 | 11/2017 | Chen | | |
| 11,049,799 B1 * | 6/2021 | Lin | ........................ | H10D 30/47 |

(Continued)

FOREIGN PATENT DOCUMENTS

| | | | |
|---|---|---|---|
| CN | 204732413 | A | 10/2015 |
| CN | 112216736 | A | 1/2021 |
| CN | 113451393 | A | 9/2021 |

OTHER PUBLICATIONS

McCallum-Cook, Ian et a., "Seal Rings for a Wide Band-Gap Semiconductor Layer Stack" filed on Sep. 6, 2023 as a U.S. Appl. No. 18/242,906.

(Continued)

*Primary Examiner* — Yasser A Abdelaziez

(74) *Attorney, Agent, or Firm* — Thompson Hine LLP; Francois Pagette

(57) ABSTRACT

Structures including a compound semiconductor layer stack and methods of forming such structures. The structure comprises a device region on a substrate. The device region includes a first section of a layer stack that has a plurality of semiconductor layers, and each semiconductor layer comprises a compound semiconductor material. The structure further comprises an isolation structure disposed about the section of the layer stack, and a device in the device region. The isolation structure penetrates through the layer stack to the substrate.

20 Claims, 6 Drawing Sheets

(56) References Cited

U.S. PATENT DOCUMENTS

| | | | | |
|---|---|---|---|---|
| 11,322,387 | B1 | 5/2022 | Rana et al. | |
| 11,508,839 | B2 | 11/2022 | Yang | |
| 2005/0035426 | A1 * | 2/2005 | Ko | H10D 64/01326 257/E21.549 |
| 2016/0043218 | A1 * | 2/2016 | Moens | H01L 21/746 257/329 |
| 2020/0219772 | A1 * | 7/2020 | Ramaswamy | H10D 8/60 |
| 2020/0402855 | A1 | 12/2020 | Lin et al. | |
| 2021/0013333 | A1 * | 1/2021 | Yang | H01L 21/76283 |
| 2021/0327873 | A1 * | 10/2021 | Lan | H03F 3/213 |
| 2021/0391321 | A1 * | 12/2021 | Dutta | H10D 84/0107 |

OTHER PUBLICATIONS

European Patent Office; Extended European Search Report and Opinion issued in European Patent Application No. 24153568.1 on Jul. 19, 2024; 9 pages.

X. Li et al., "Suppression of the Backgating Effect of Enhancement-Mode p-GaN HEMTs on 200-mm GaN-on-SOI for Monolithic Integration," in IEEE Electron Device Letters, vol. 39, No. 7, pp. 999-1002, Jul. 2018, doi: 10.1109/LED.2018.2833883.

Li, Xiangdong et al,. "200 V Enhancement-mode p-GaN HEMTs Fabricated on 200 mm GaN-on-SOI with Trench Isolation for Monolithic Integration." (2017) IEEE Electron Device Letters. pp. 1-1. 10.1109/LED.2017.2703304.

Susai, Lawrence Selvaraj et al., "Compound Semiconductor-Based Devices With Stress-Reduction Features" filed on Jul. 14, 2022 as a U.S. Appl. No. 17/864,499.

Levy, Mark D. et a., "Seal Ring Structures" filed on Jan. 10, 2023 as a U.S. Appl. No. 18/095,156.

* cited by examiner

STRESS-REDUCTION STRUCTURES FOR A COMPOUND SEMICONDUCTOR LAYER STACK

STATEMENT REGARDING FEDERALLY SPONSORED RESEARCH OR DEVELOPMENT

This invention was made with government support under HQ0727790700 awarded by the Defense Microelectronics Activity. The government has certain rights in the invention.

BACKGROUND

This disclosure relates to semiconductor device fabrication and integrated circuits and, more specifically, to structures including a compound semiconductor layer stack and methods of forming such structures.

Compound semiconductor-based devices, such as high-electron-mobility transistors, may be deployed in high-voltage power electronics. Compound semiconductors are characterized by material properties, such as a carrier mobility that is greater than the carrier mobility of silicon and a wider band gap than silicon, that can be exploited. Compound semiconductors may include Group III elements (e.g., aluminum, gallium, and/or indium) and Group V elements (e.g., nitrogen, phosphorus, arsenic, and/or antimony) combined with the Group III elements. A common wide-band-gap compound semiconductor employed in constructing compound semiconductor-based devices is gallium nitride. A high-electron-mobility transistor may include a heterojunction between crystalline compound semiconductor materials having different band gaps, such as a heterojunction between binary gallium nitride and trinary aluminum-gallium nitride. During operation, a two-dimensional electron gas is formed near the heterojunction and defines the channel of the high-electron-mobility transistor.

A compound semiconductor-based device may include a stack of compound semiconductor layers that are grown by heteroepitaxy on a wafer. Stress may be managed by tailoring the compound semiconductor layers during epitaxial growth. Despite the goal of managing stress during epitaxial growth, the wafer and layer stack may nonetheless incorporate a significant level of post-growth stress. The incorporated stress may cause wafer cracking or wafer breakage during subsequent thermal and mechanical steps. Reducing the thickness of the wafer may exacerbate cracking and breakage during subsequent thermal and mechanical steps.

Improved structures including a compound semiconductor layer stack and methods of forming such structures are needed.

SUMMARY

In an embodiment of the invention, a structure comprises a device region on a substrate. The device region includes a section of a layer stack that has a plurality of semiconductor layers, and each semiconductor layer comprises a compound semiconductor material. The structure further comprises an isolation structure disposed about the section of the layer stack, and a device in the device region. The isolation structure penetrates through the layer stack to the substrate.

In an embodiment of the invention, a method comprises forming a device region on a substrate, wherein the device region includes a section of a layer stack, the layer stack includes a plurality of semiconductor layers, and each semiconductor layer comprises a compound semiconductor material. The method further comprises forming an isolation structure disposed about the section of the layer stack and forming a device in the device region. The isolation structure penetrates through the layer stack to the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
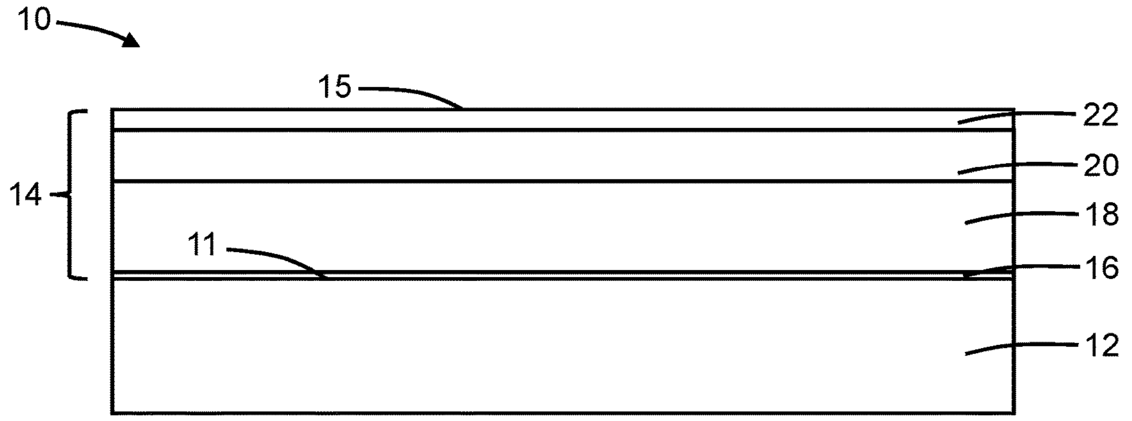
FIG. 1 is a cross-sectional view of a structure at an initial fabrication stage of a processing method in accordance with embodiments of the invention.

With reference to FIG. 1 and in accordance with embodiments of the invention, a structure 10 may include a substrate 12 and a layer stack 14 formed on a top surface 11 of the substrate 12. The substrate 12 may be a bulk wafer that is comprised of a single-crystal semiconductor material, such as single-crystal silicon. In an embodiment, the single-crystal semiconductor material of the substrate 12 may have a diamond crystal lattice structure with a <111> crystal orientation as specified by Miller indices. In an embodiment, the substrate 12 may contain single-crystal silicon with a diamond crystal lattice structure having a <111> crystal orientation. For a substrate 12 having a <111> crystal orientation, the (111) crystallographic plane is parallel to the top surface of the substrate 12, and the [111] crystallographic direction is normal to the (111) plane. In an embodiment, the substrate 12 may be fully comprised of semiconductor material with a <111> crystal orientation. The substrate 12 may be doped with a p-type dopant, such as boron. In alternative embodiments, the substrate 12 may be a different type of substrate, such as a sapphire substrate, an engineered substrate, etc. In alternative embodiments, the substrate 12 may be a silicon-on-insulator substrate.

The layer stack 14 may include a seed layer 16, a buffer layer 18, a channel layer 20, and a donor layer 22 each containing one or more compound semiconductor materials. The seed layer 16, which provides a thin nucleation film for the growth of the buffer layer 18, may be comprised of, for example, aluminum nitride. The layers 16, 18, 20, 22 may be serially deposited using an epitaxial growth process, such as metalorganic chemical vapor deposition, vapor phase epitaxy, or molecular beam epitaxy, to form the layer stack 14. The layer stack 14 may have a thickness, for example, of about one micron to about five microns between a top surface 15 of the layer stack 14 and the top surface 11 of the substrate 12.

The layers 16, 18, 20, 22 of the layer stack 14 may each have a crystal structure that is single crystal or, alternatively, a crystal structure that is substantially single crystal with varying levels of crystalline defectivity present. The buffer layer 18 may be comprised of one or more binary or ternary III-V compound semiconductor materials, such as gallium nitride, aluminum nitride, aluminum gallium nitride, or a combination of these materials. The buffer layer 18 may include a superlattice that is tailored in terms of material composition, doping, layering, and/or layer thickness to accommodate lattice mismatch, thermal property differences, and mechanical property differences between the material of the substrate 12 and the material of the channel layer 20. The channel layer 20, which is disposed over the buffer layer 18, may contain, for example, gallium nitride doped with carbon or iron. The donor layer 22, which is disposed over the channel layer 20, may contain a ternary III-V compound semiconductor, such as aluminum gallium nitride, that provides an heterogenous interface with the buffer layer 18 of different composition. The channel layer 20 may include a layer comprised of undoped gallium nitride adjacent to the donor layer 22, and an optional barrier layer comprised of, for example, aluminum nitride may be located between the channel layer 20 and the donor layer 22.

Figure 2:
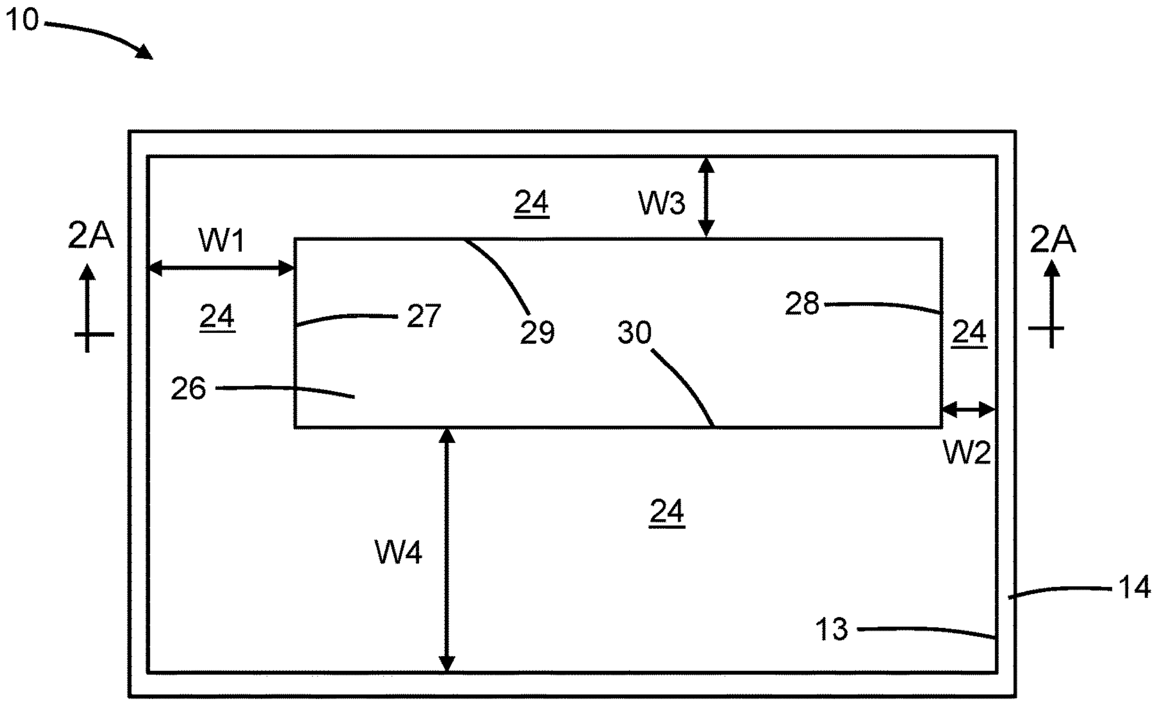
FIG. 2 is a top view of the structure at a fabrication stage subsequent to FIG. 1.
Figure 2A:
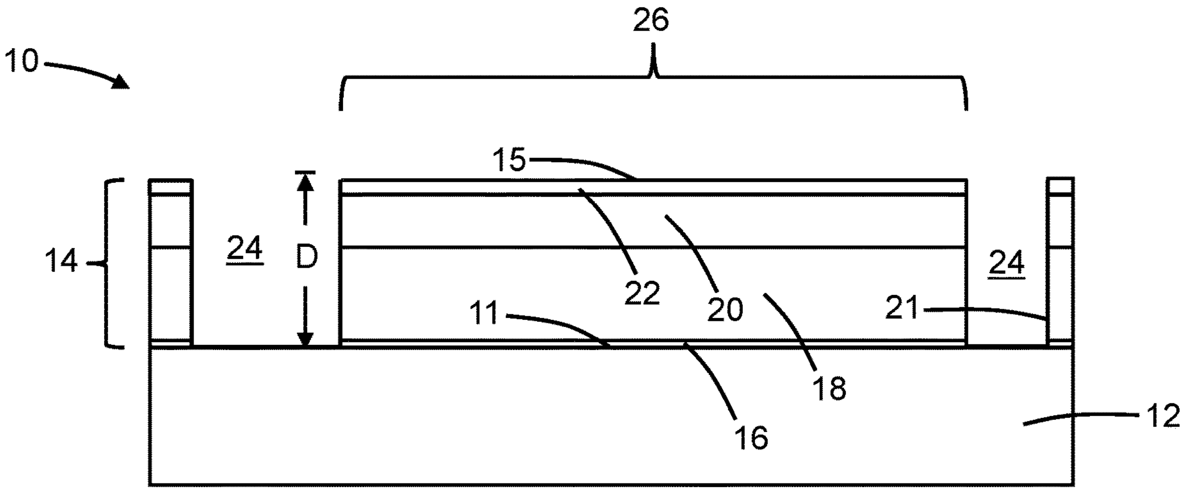
FIG. 2A is a cross-sectional view taken generally along line 2A-2A in FIG. 2.

With reference to FIGS. 2, 2A in which like reference numerals refer to like features in FIG. 1 and at a subsequent fabrication stage, a device region 26 may be formed by patterning the layer stack 14 with lithography and etching processes to define channels 24. In an embodiment, an etch mask may be formed by a lithography process over the layer stack 14, and unmasked sections of the layer stack 14 may be etched and removed with an etching process to define the channels 24. The masked section of the layer stack 14 may determine the patterned shape of the device region 26 and the patterned shapes of the channels 24. In an embodiment the etching process may be a reactive ion etching process. The device region 26 represents an unpatterned and intact section of the layer stack 14 that is surrounded on all sides by different channels 24.

The channels 24 penetrate from the top surface 15 into the layer stack 14. In an embodiment, the channels 24 may extend from the top surface 15 fully through the entire thickness of the layer stack 14 to the substrate 12 such that the bottoms of the channels 24 are coextensive with the substrate 12. In an embodiment, the channels 24 and the device region 26 may be surrounded on all sides by non-patterned sections of the layer stack 14 to define a patterned area that is surrounded by an edge 13. In an embodiment, the channels 24 may occupy at least forty (40) percent of the patterned area that includes the channels 24 and device region 26. In an embodiment, the channels 24 may occupy forty (40) percent to ninety (90) percent of the patterned area that includes the channels 24 and device region 26. In an embodiment, the channels 24 may occupy five (5) percent to ninety (90) percent of the patterned area that includes the channels 24 and device region 26.

The channels 24, which adjoin the perimeter of the device region 26 and the surrounding sections of the layer stack 14, define a continuous recessed space relative to the top surface 15 of the layer stack 14. The channels 24 have aspect ratios of width-to-depth contingent upon their position inside the patterned area. A depth D of the channels 24, which may be measured from the top surface 15 of the layer stack 14 to the top surface 11 of the substrate 12, may be uniform over an extent of the patterned area. In an embodiment, the width of the channels 24 may vary to provide different aspect ratios.

The channel 24 between an edge 27 of the device region 26 and the adjacent section of the layer stack 14 bordering the patterned area at the edge 13 may be characterized by a width W1. The channel 24 between an edge 28 of the device region 26 and the adjacent section of the layer stack 14 bordering the patterned area at the edge 13 may be characterized by a width W2. The channel 24 between an edge 29 of the device region 26 and the adjacent section of the layer stack 14 bordering the patterned area at the edge 13 may be characterized by a width W3. The channel 24 between an edge 30 of the device region 26 and the adjacent section of the layer stack 14 bordering the patterned area at the edge 13 may be characterized by a width W4. In an embodiment, the widths of at least two of the channels 24 arranged about the device region 26 may differ. In an embodiment, the widths of all of the channels 24 arranged about the device region 26 may differ. For example, the width W1 may be greater than the widths W2, W3, W4, the width W2 may be less than the widths W1, W3, W4, and the width W3 may be less than the width W4. In an embodiment, the difference in the aspect ratio between a pair of the channels 24, such as the channel 24 with the width W1 and the channel 24 with the width W2, may be greater than an order of magnitude. In an embodiment, the difference in the aspect ratio between a pair of the channels 24, such as the channel 24 with the width W1 and the channel 24 with the width W2, may be greater than two orders of magnitude.

In an embodiment, the channels 24 may have vertical sidewalls 21. In an alternative embodiment, the channels 24 may have inclined sidewalls 21. The patterned portion of the layer stack 14 constituting the device region 26 border the sidewalls 21 of the channels 24. The widths of the channels 24 may be evaluated at the top surface 15 of the layer stack 14. In an embodiment, the widths of the channels 24 may be measured as perpendicular distances between the device region 26 and the surrounding sections of the layer stack 14 at the perimeter of the channels 24.

The device region 26 of the layer stack 14 may be subsequently processed to form an individual device. In an alternative embodiment, the device region 26 of the layer stack 14 may be subsequently processed to form multiple devices.

The channels 24 may function to relieve stresses between the substrate 12 and the layer stack 14 after the layer stack 14 is epitaxially grown on the top surface 11 of the substrate 12. The channels 24 are formed before a device is formed in the device region 26. The stress relief may reduce or eliminate the occurrence of wafer cracking and/or wafer breakage during subsequent thermal and mechanical processing steps used to form the device.

Figure 3:
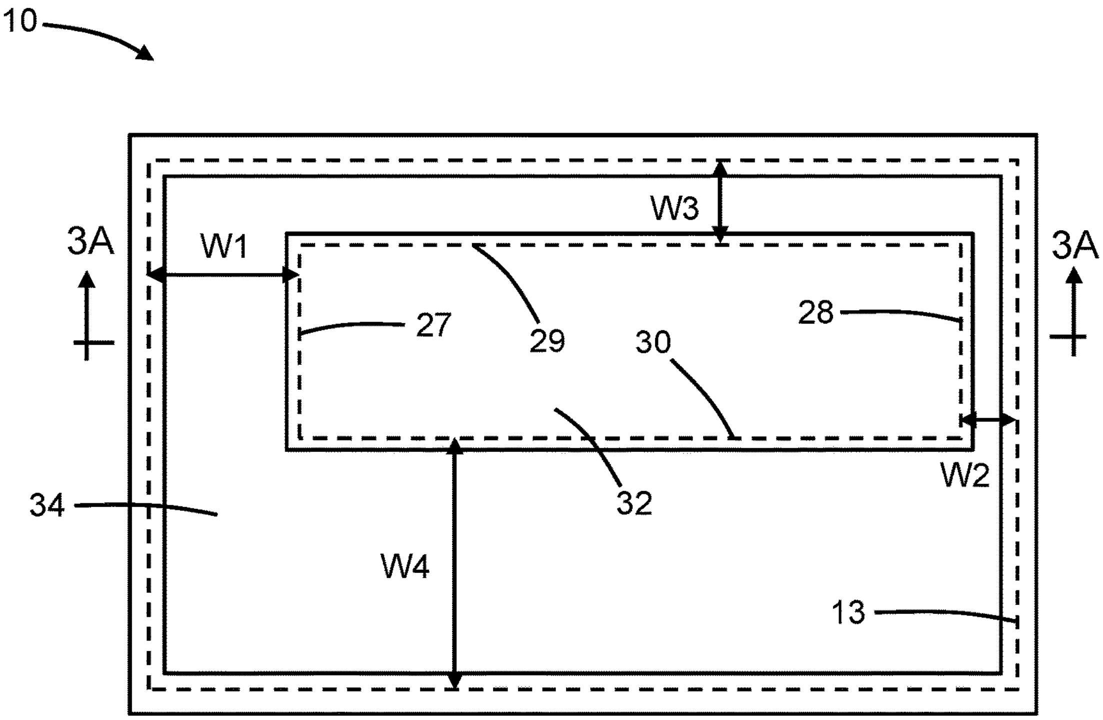
FIG. 3 is a top view of the structure at a fabrication stage subsequent to FIG. 2.
Figure 3A:
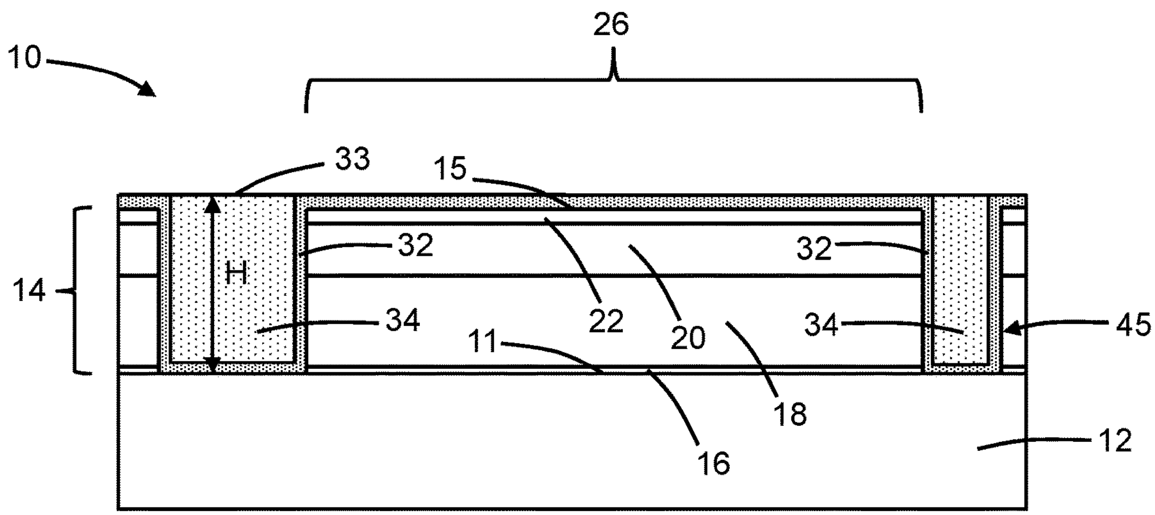
FIG. 3A is a cross-sectional view taken generally along line 3A-3A in FIG. 3.

With reference to FIGS. 3, 3A in which like reference numerals refer to like features in FIGS. 2, 2A and at a subsequent fabrication stage, a liner 32 may be formed that coats portions of the top surface 11 of the substrate 12 exposed by the channels 24, as well as the top surface 15 of the section of the layer stack 14 constituting the device region 26 and the sections of the layer stack 14 surrounding the patterned area including the device region 26 and channels 24. In an embodiment, the liner 32 may be comprised of a dielectric material, such as silicon nitride, that is an electrical insulator. In an embodiment, the liner 32 may be conformal with a thickness that is uniform independent of topography. The liner 32, which only partially fills the channels 24, may function as a moisture barrier for the layer stack 14.

A layer 34 is formed that may fill the remainder of the volume inside the channels 24 that is unfilled by the liner 32. The layer 34 may be deposited and polished by a chemical-mechanical polishing process with the liner 32 functioning as a polish stop. In an embodiment, the layer 34 may have a top surface 33 that is substantially coplanar with the top surface 15 of the layer stack 14. In an embodiment, the top surface 33 of the layer 34 may be coplanar with the liner 32 on the top surface 15 of the section of the layer stack 14 constituting the device region 26 and on the sections of the layer stack 14 surrounding the patterned area including the device region 26.

In an embodiment, the layer 34 may be comprised of a different material than the liner 32. In an embodiment, the layer 34 may be comprised of a dielectric material, such as silicon dioxide, that is an electrical insulator. In an embodiment, the liner 32 may be comprised of silicon nitride, and the layer 34 may be comprised of silicon dioxide. In an embodiment, the layer 34 may be comprised of a metal, such as tungsten, that is an electrical conductor and that is electrically isolated from the substrate 12 and layer stack 14 at the sidewalls 21 by the liner 32. In an embodiment, the liner 32 may be comprised of silicon nitride, and the layer 34 may be comprised of tungsten. In an embodiment, the layer 34 may be comprised of a polycrystalline semiconductor material, such as polysilicon, that creates a trap-rich interface. In an embodiment, the liner 32 may be comprised of silicon nitride, and the layer 34 may be comprised of polysilicon.

The liner 32 and layer 34 inside the channels 24 may collectively provide an isolation structure 45. The isolation structure 45 adjoins different portions of the device region 26 about its perimeter. The liner 32 and layer 34 of the isolation structure 45 may incorporate compressive stress that compensates for tensile stress incorporated into the layer stack 14.

The isolation structure 45 inside the channels 24 has multiple aspect ratios of width-to-height dependent upon location about the device region 26. A height H of the isolation structure 45, which may be measured from the top surface 15 of the layer 34 to the top surface 11 of the substrate 12, may be uniform with position inside the channels 24, and the height H may be slightly greater than the depth D of the channels 24. In an embodiment, the width of different portions of the isolation structure 45 may vary to provide different aspect ratios of width-to-height. In an embodiment, the width of the different portions of the isolation structure 45 may be equal to the widths of the different channels 24. The portion of the isolation structure 45 in the channel 24 between the edge 27 of the device region 26 and the adjacent section of the layer stack 14 bordering the patterned area at the edge 13 may be characterized by the width W1. The portion of the isolation structure 45 in the channel 24 between the edge 28 of the device region 26 and the adjacent section of the layer stack 14 bordering the patterned area at the edge 13 may be characterized by the width W2. The portion of the isolation structure 45 in the channel 24 between the edge 29 of the device region 26 and the adjacent section of the layer stack 14 bordering the patterned area at the edge 13 may be characterized by the width W3. The portion of the isolation structure 45 in the channel 24 between the edge 30 of the device region 26 and the adjacent section of the layer stack 14 bordering the patterned area at the edge 13 may be characterized by the width W4. In an embodiment, the widths of at least two portions of the isolation structure 45 arranged about the device region 26 may differ. In an embodiment, the widths of all of the portions of the isolation structure 45 arranged about the device region 26 may differ. For example, the width W1 may be greater than the widths W2, W3, W4, the width W2 may be less than the widths W1, W3, W4, and the width W3 may be less than the width W4. In an embodiment, the difference in the aspect ratio between a pair of the portions of the isolation structure 45, such as the portion of the isolation structure 45 with the width W1 and the portion of the isolation structure 45 with the width W2, may be greater than an order of magnitude. In an embodiment, the difference in the aspect ratio between a pair of the portions of the isolation structure 45, such as the portion of the isolation structure 45 with the width W1 and the portion of the isolation structure 45 with the width W2, may be greater than two orders of magnitude. In an embodiment, the widths of the portions of the isolation structure 45 may be measured as perpendicular distances between the device region 26 and the surrounding sections of the layer stack 14 at the perimeter of the patterned area.

Figure 4:
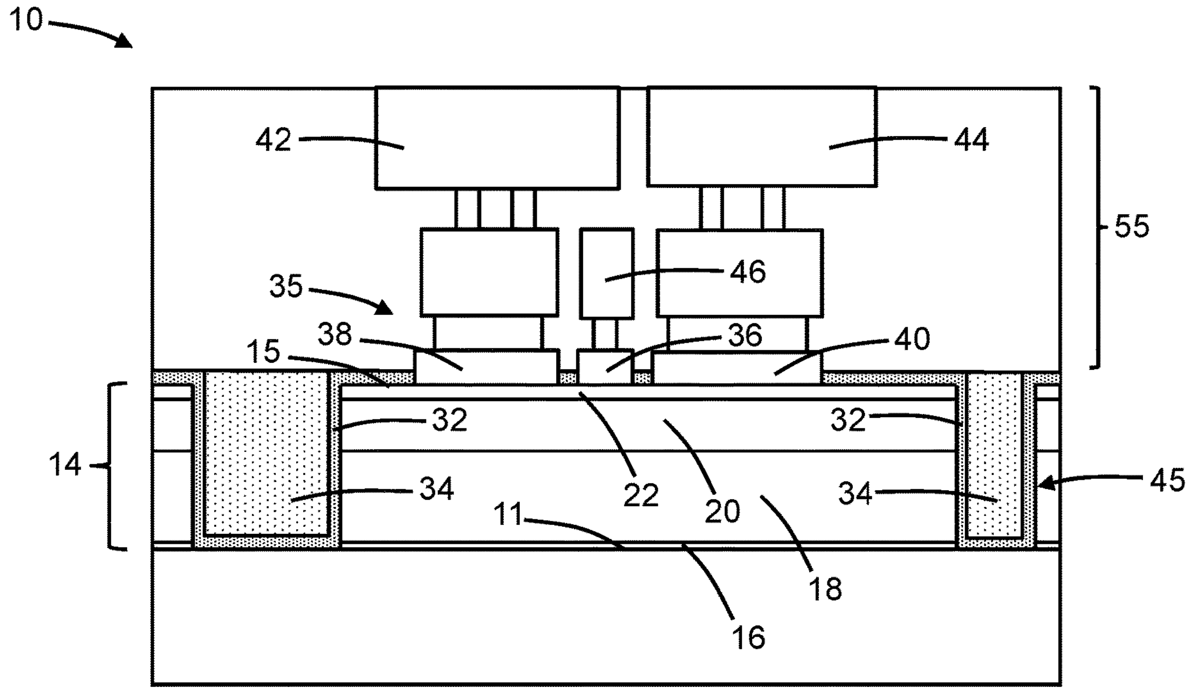
FIG. 4 is a cross-sectional view of the structure at a fabrication stage subsequent to FIGS. 3, 3A.

With reference to FIG. 4 in which like reference numerals refer to like features in FIGS. 3, 3A and at a subsequent fabrication stage, a device in the representative form of a high-electron-mobility transistor 35 may be formed in the device region 26. The high-electron-mobility transistor 35 includes a gate 36, a source ohmic contact 38, and a drain ohmic contact 40 that are disposed at the top surface of the layer stack 14 in the device region 26. In an embodiment, the gate 36 may contain one or more III-V compound semiconductor materials and may also include a cap comprised of, for example, titanium nitride. In an embodiment, the source ohmic contact 38 and drain ohmic contact 40 may comprise an ohmic metal, such as titanium, titanium nitride, aluminum, silicon, or a combination of these materials. The gate 36 is positioned in a lateral direction between the source ohmic contact 38 and the drain ohmic contact 40.

Middle-of-line processing and back-end-of-line processing follow, which includes formation of contacts, vias, and wiring for an interconnect structure 55 positioned over the substrate 12 and connected to the gate 36, source ohmic contact 38, and drain ohmic contact 40. An electrical connection 42 includes contacts, interconnects, and vias in metallization levels of the interconnect structure 55 that are coupled to the source ohmic contact 38 of the high-electron-mobility transistor 35. An electrical connection 44 includes contacts, interconnects, and vias in metallization levels of the interconnect structure 55 that are coupled to the drain ohmic contact 40 of the high-electron-mobility transistor 35. An electrical connection 46 includes interconnects and contacts in a metallization level of the interconnect structure 55 that are coupled to the gate 36 of the high-electron-mobility transistor 35. In an embodiment, the isolation structure 45 in the channels 24 may be non-contacted by electrical connections in the interconnect structure 55.

The isolation structure 45 may enhance electrical isolation during high-frequency operation of the high-electron-mobility transistor 35. In an alternative embodiment, the device region 26 may include multiple transistors, each similar or identical to the high-electron-mobility transistor 35, for which the electrical isolation may be enhanced during high-frequency operation.

Figure 5:
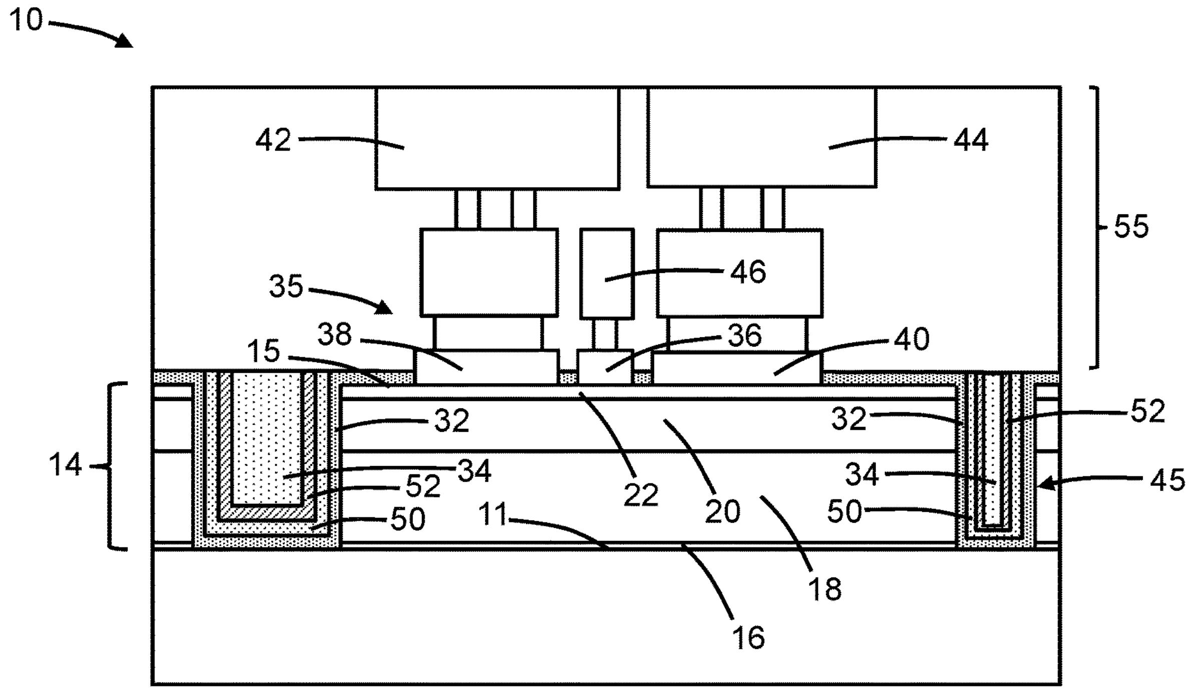
FIG. 5 is a cross-sectional view of a structure in accordance with alternative embodiments of the invention.

With reference to FIG. 5 and in accordance with alternative embodiments, the structure 10 may be modified such that the layer 34 only fills a portion of the volume inside the channels 24 that is unfilled by the liner 32. The isolation structure 45 may further include layers 50, 52 that fill portions of the volume inside the channels 24 that are unfilled by the liner 32 and the layer 34. The layers 50, 52 may be formed after forming the layer 34. The layer 52 may be disposed between the layer 50 and the layer 34. In an embodiment, the layer 34 may be comprised of a polycrystalline semiconductor material, such as polysilicon, that creates a trap-rich interface. In an embodiment, the layer 50 and the layer 52 may be comprised of a dielectric material, such as silicon dioxide, that is an electrical insulator. In an embodiment, the layer 34 and the layer 50 may be comprised of different dielectric materials.

Figure 6:
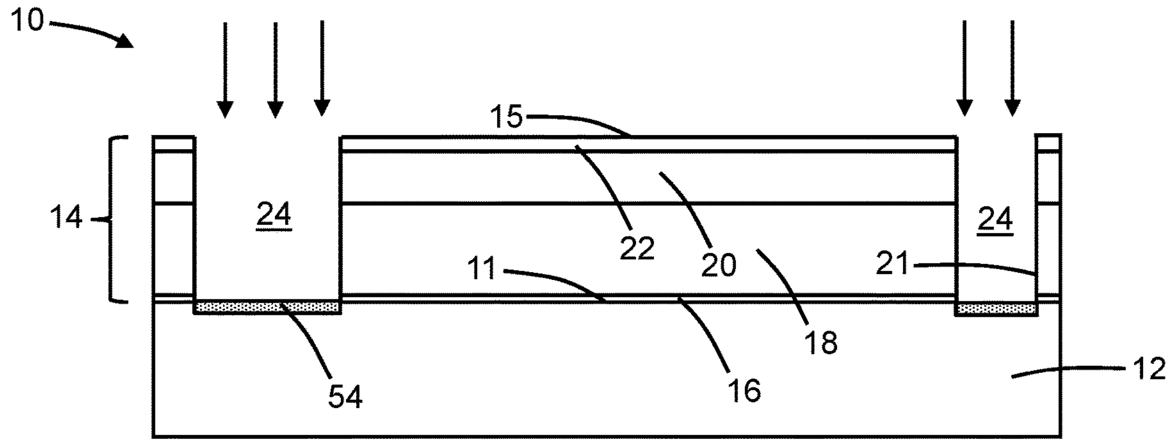
FIG. 6 is a cross-sectional view of a structure in accordance with alternative embodiments of the invention.

With reference to FIG. 6 and in accordance with alternative embodiments, a damaged region 54 may be formed in the substrate 12 at the bottom of each channel 24. The damaged region 54 may be formed by introducing energetic ions by ion implantation, as indicated by the single-headed arrows, into the substrate 12. A patterned implantation mask (not shown) may be formed to define selected areas (e.g., location and horizontal dimensions) on the top surface 15 of the layer stack 14 that expose the channels 24 for implantation to define the damaged region 54. The implantation conditions (e.g., ion species, dose, kinetic energy) may be selected to tune the electrical and physical characteristics of the damaged region 54. In an embodiment, the implantation conditions may include a normal angle of incidence for the ions. In an embodiment, the material of the damaged region 54 may be formed by implanting ions of an electrically-inactive species, such as nitrogen or argon, in the material of the substrate 12. In an embodiment, the material of the damaged region 54 may be formed by implanting ions of an electrically-active species, such as arsenic or phosphorus, in the material of the substrate 12. In an embodiment, the material of the damaged region 54 may have a higher resistivity than the undamaged material of the substrate 12. The process flow continues to form the isolation structure 45 and the high-electron-mobility transistor 35.

Figure 7:
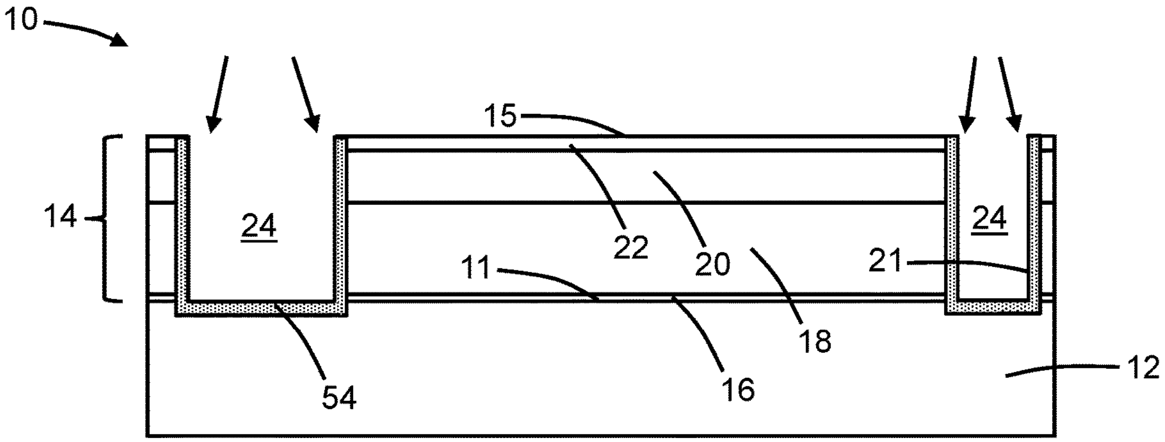
FIG. 7 is a cross-sectional view of a structure in accordance with alternative embodiments of the invention.

With reference to FIG. 7 in which like reference numerals refer to like features in FIG. 6 and in accordance with alternative embodiments, the damaged region 54 may be formed in the substrate 12 and in the layer stack 14 at the sidewalls 21 of the channels 24 bordering the device region 26. The damaged region 54 may be formed by introducing energetic ions by ion implantation, as indicated by the single-headed arrows, into the layer stack 14 under tilted or angled implantation conditions. Alternatively, the damaged region 54 may result if the sidewalls 21 of the channels 24 are inclined. The process flow continues to form the isolation structure 45 and the high-electron-mobility transistor 35.

Figure 8:
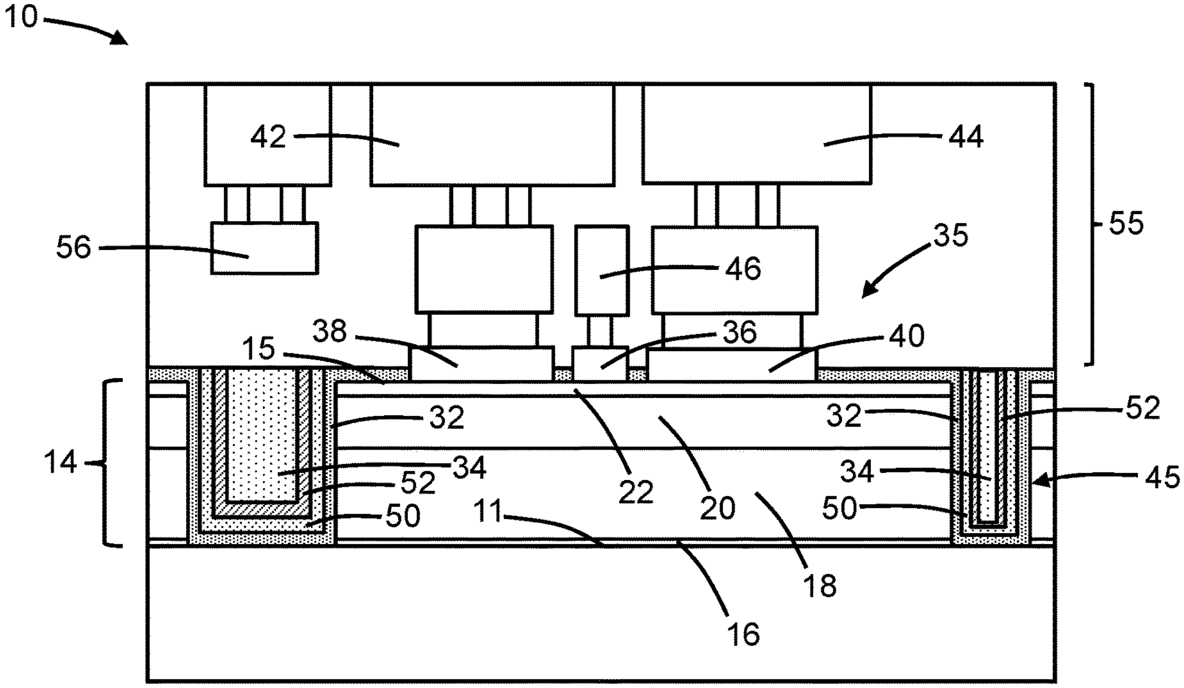
FIG. 8 is a cross-sectional view of a structure in accordance with alternative embodiments of the invention.

With reference to FIG. 8 and in accordance with alternative embodiments, a passive device 56, such as a capacitor or inductor, may be formed in one or more of the metallization levels of the interconnect structure 55. The isolation structure 45 may be disposed between the passive device 56 and the substrate 12 such that the passive device 56 does not overlie a portion of the layer stack 14.

Figure 9:
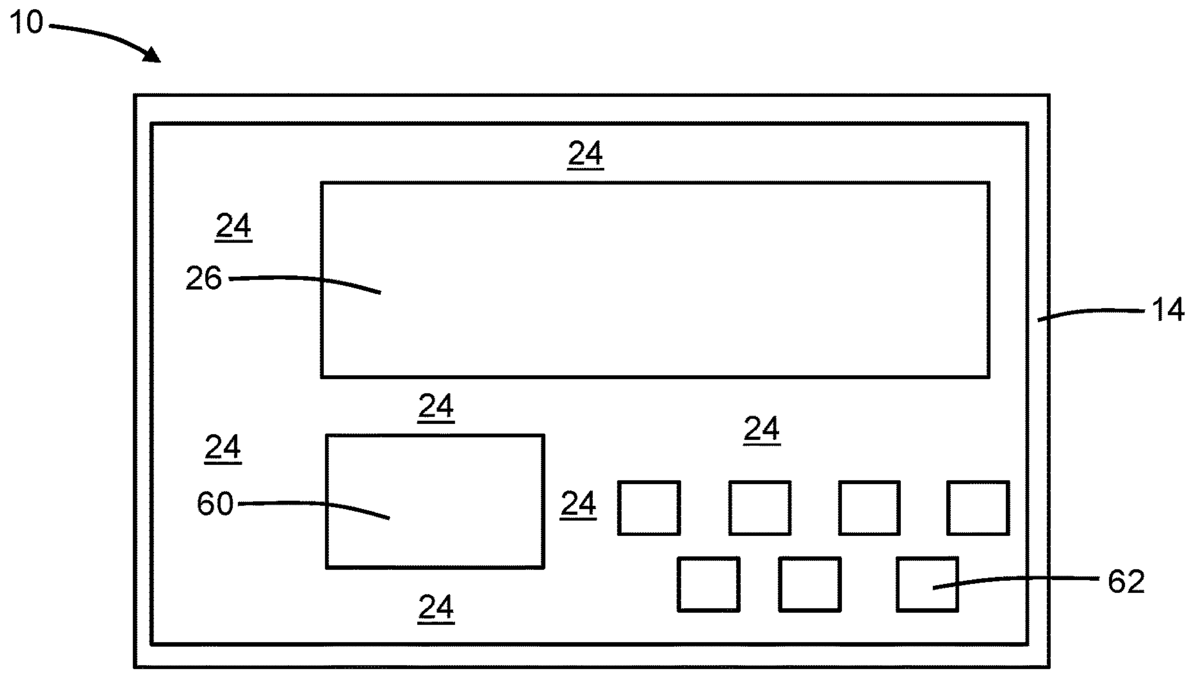
FIG. 9 is a top view of a structure in accordance with alternative embodiments of the invention.

With reference to FIG. 9 and in accordance with alternative embodiments, the structure 10 may include an additional device region 60 disposed in the patterned area and in which one or more high-electron-mobility transistors 35 may be formed. The structure 10 may also include fill shapes 62 that are disposed in the patterned area. The device region 60 and the fill shapes 62, which are constituted by sections of the layer stack 14, may be formed similar to, and concurrently with, the formation of the device region 26. In particular, the device region 60 and the fill shapes 62 may sections of the layer stack 14. Additional channels 24 are defined in the patterned area between the device region 60 and the device region 26, between the fill shapes 62 and the device region 60, between the fill shapes 62 and the device region 26, etc. In an alternative embodiment, only the device region 60 may be added to the structure 10. In an alternative embodiment, only the fill shapes 62 may be added to the structure 10.

The process flow continues to form the isolation structure 45 and the high-electron-mobility transistor 35. The isolation structure 45 includes portions of different aspect ratio in the channels 24 between the different sections of the layer stack 14 embodied in the device region 26, the device region 60, and the fill shapes 62.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as “about”, “approximately”, and “substantially”, are not to be limited to the precise value specified. The language of approximation may correspond to the precision of an instrument used to measure the value and, unless otherwise dependent on the precision of the instrument, may indicate +/−10% of the stated value(s).

References herein to terms such as “vertical”, “horizontal”, etc. are made by way of example, and not by way of limitation, to establish a frame of reference. The term “horizontal” as used herein is defined as a plane parallel to a conventional plane of a semiconductor substrate, regardless of its actual three-dimensional spatial orientation. The terms “vertical” and “normal” refer to a direction perpendicular to the horizontal, as just defined. The term “lateral” refers to a direction within the horizontal plane.

A feature “connected” or “coupled” to or with another feature may be directly connected or coupled to or with the other feature or, instead, one or more intervening features may be present. A feature may be “directly connected” or “directly coupled” to or with another feature if intervening features are absent. A feature may be “indirectly connected” or “indirectly coupled” to or with another feature if at least one intervening feature is present. A feature “on” or “contacting” another feature may be directly on or in direct contact with the other feature or, instead, one or more intervening features may be present. A feature may be “directly on” or in “direct contact” with another feature if intervening features are absent. A feature may be “indirectly on” or in “indirect contact” with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a substrate;

an interconnect structure on the substrate;

a device region on the substrate, the device region including a section of a layer stack that includes a plurality of compound semiconductor layers, and the layer stack having a top surface;

an isolation structure surrounding the section of the layer stack, the isolation structure including a plurality of recesses penetrating from the top surface of the layer stack fully through the layer stack to the substrate, the isolation structure including a first layer that has a first portion as a liner inside each of the plurality of recesses and a second portion on the top surface of the section of the layer stack, the isolation structure including a second layer inside each of the plurality of recesses on the first portion of the first layer, the first layer comprising silicon nitride, and the second layer comprising a dielectric material; and a high-mobility field-effect transistor in the device region, wherein the second layer is conformal with a thickness that is uniform independent of topography, and the second layer only partially fills the plurality of recesses.

2. The structure of claim 1 wherein the high-mobility field-effect transistor includes a source ohmic contact, a drain ohmic contact, and a gate.

3. The structure of claim 1 wherein the isolation structure includes a first portion having a first aspect ratio and a second portion having a second aspect ratio different from the first aspect ratio, and the first portion of the isolation structure and the second portion of the isolation structure adjoin different portions of the device region.

4. The structure of claim 3 wherein the first portion and the second portion of the isolation structure have equal heights.

5. A structure comprising:

a substrate;

an interconnect structure on the substrate;

a device region on the substrate, the device region including a section of a layer stack that includes a plurality of compound semiconductor layers, and the layer stack having a top surface;

an isolation structure surrounding the section of the layer stack, the isolation structure including a plurality of recesses penetrating from the top surface of the layer stack fully through the layer stack to the substrate, the isolation structure including a first layer that has a first portion as a liner inside each of the plurality of recesses and a second portion on the top surface of the section of the layer stack, the isolation structure including a second layer inside each of the plurality of recesses on the first portion of the first layer, the first layer comprising silicon nitride, and the second layer comprising a polycrystalline semiconductor material; and a high-mobility field-effect transistor in the device region.

6. A structure comprising:

a substrate;

an interconnect structure on the substrate;

a device region on the substrate, the device region including a section of a layer stack that includes a plurality of compound semiconductor layers, and the layer stack having a top surface;

an isolation structure surrounding the section of the layer stack, the isolation structure including a plurality of recesses penetrating from the top surface of the layer stack fully through the layer stack to the substrate, the isolation structure including a first layer that has a first portion as a liner inside each of the plurality of recesses and a second portion on the top surface of the section of the layer stack, the isolation structure including a second layer inside each of the plurality of recesses on the first portion of the first layer, the first layer comprising silicon nitride, and the second layer comprising a metal; and a high-mobility field-effect transistor in the device region.

7. The structure of claim 1 wherein at least one of the plurality of compound semiconductor layers comprises gallium nitride.

8. The structure of claim 1 wherein the device region is fully surrounded by the plurality of recesses in a patterned area, and the plurality of recesses occupy 40 percent to 90 percent of the patterned area.

9. The structure of claim 1 wherein the plurality of recesses have respective bottoms that adjoin the substrate, and further comprising:

a damaged region of semiconductor material in the substrate adjacent to the respective bottoms of the plurality of recesses.

10. The structure of claim 1 wherein the plurality of recesses have respective bottoms that adjoin the section of the layer stack, and further comprising:

a damaged region of semiconductor material in the section of the layer stack adjacent to a sidewall of each of the plurality of recesses.

11. The structure of claim 1 further comprising:

a passive device in the interconnect structure, wherein the isolation structure is disposed between the passive device and the substrate, the passive device overlaps with the isolation structure, and the passive device does not overlap with a portion of the layer stack.

12. The structure of claim 1 wherein the second layer has a top surface that is coplanar with the second portion of the first layer.

13. The structure of claim 1 wherein the dielectric material is silicon dioxide.

14. The structure of claim 5 wherein the second layer has a top surface that is coplanar with the second portion of the first layer.

15. The structure of claim 6 wherein the second layer has a top surface that is coplanar with the second portion of the first layer.

16. The structure of claim 1 wherein the substrate comprises a single-crystal semiconductor material, and the plurality of recesses extend through an entire thickness of the layer stack to the single-crystal semiconductor material of the substrate.

17. The structure of claim 5 wherein the isolation structure includes a first portion having a first aspect ratio and a second portion having a second aspect ratio different from the first aspect ratio, and the first portion of the isolation structure and the second portion of the isolation structure adjoin different portions of the device region.

18. The structure of claim 5 wherein the substrate comprises a single-crystal semiconductor material, and the plurality of recesses extend through an entire thickness of the layer stack to the single-crystal semiconductor material of the substrate.

19. The structure of claim 6 wherein the isolation structure includes a first portion having a first aspect ratio and a second portion having a second aspect ratio different from the first aspect ratio, and the first portion of the isolation structure and the second portion of the isolation structure adjoin different portions of the device region.

20. The structure of claim 6 wherein the substrate comprises a single-crystal semiconductor material, and the plurality of recesses extend through an entire thickness of the layer stack to the single-crystal semiconductor material of the substrate.

* * * * *